(12) United States Patent
Kim

(10) Patent No.: US 6,442,717 B1
(45) Date of Patent: Aug. 27, 2002

(54) PARALLEL BIT TESTING CIRCUITS AND METHODS FOR INTEGRATED CIRCUIT MEMORY DEVICES INCLUDING SHARED TEST DRIVERS

(75) Inventor: Byung-chul Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/274,706

(22) Filed: Mar. 23, 1999

(30) Foreign Application Priority Data

Mar. 23, 1998 (KR) ............................................. 98-9964

(51) Int. Cl.[7] .............................. G11C 29/00; G11C 7/00
(52) U.S. Cl. ......................................... 714/719; 365/201
(58) Field of Search ................................ 714/719, 718; 365/201

(56) References Cited

U.S. PATENT DOCUMENTS

| | | | | |
|---|---|---|---|---|
| 3,772,595 A | * | 11/1973 | De Wolf et al. | 714/736 |
| 3,921,142 A | * | 11/1975 | Bryant et al. | 708/350 |
| 4,363,124 A | * | 12/1982 | Aichelmann, Jr. | 714/719 |
| 4,899,313 A | * | 2/1990 | Kumanoya et al. | 365/201 |
| 5,381,421 A | * | 1/1995 | Dickol et al. | 714/744 |
| 5,471,480 A | * | 11/1995 | You | 714/719 |
| 5,646,948 A | * | 7/1997 | Kobayashi et al. | 714/719 |
| 5,754,486 A | * | 5/1998 | Nevill et al. | 365/201 |
| 5,777,933 A | * | 7/1998 | Horihata et al. | 365/201 |
| 5,896,330 A | * | 4/1999 | Gibson | 365/201 |
| 5,910,923 A | * | 6/1999 | Brown et al. | 365/201 |
| 5,912,850 A | * | 6/1999 | Wood et al. | 365/201 |
| 5,928,373 A | * | 7/1999 | Yoo | 714/719 |
| 5,970,073 A | * | 10/1999 | Masuda et al. | 714/738 |
| 6,032,274 A | * | 2/2000 | Manning | 714/718 |

FOREIGN PATENT DOCUMENTS

| | | | | |
|---|---|---|---|---|
| EP | 0615251 A2 | * | 9/1994 | G11C/29/00 |
| JP | 4-134800 | | 5/1992 | |
| JP | 5-54641 | | 3/1993 | |
| JP | 6-267295 | | 9/1994 | |

OTHER PUBLICATIONS

Notice to Submit Response, Korean Application No. 10-1998-0009964, Sep. 26, 2000.

* cited by examiner

Primary Examiner—Albert Decady
Assistant Examiner—Joseph D. Torres
(74) Attorney, Agent, or Firm—Myers Bigel Sibley & Sajovec

(57) ABSTRACT

Integrated circuit memory device testing circuits and methods compare data on a selected number of the data line outputs of a memory cell array to one another to produce comparison results, in response to a selection signal that indicates the selected number of the data line outputs to be compared to one another. A shared test driver is responsive to the comparison circuit to provide the comparison results to an associated global output line for at least two values of the selection signal that indicate at least two selected numbers of data line outputs to be compared to one another. By sharing test drivers, separate test drivers need not be provided for each selected number of the data line outputs that are compared to one another. The number of test drivers may therefore be reduced so that the area occupied by the testing circuits may be reduced.

6 Claims, 5 Drawing Sheets

US 6,442,717 B1

PARALLEL BIT TESTING CIRCUITS AND METHODS FOR INTEGRATED CIRCUIT MEMORY DEVICES INCLUDING SHARED TEST DRIVERS

FIELD OF THE INVENTION

This invention relates to integrated circuit memory devices and more particularly to circuits and methods for testing memory cell arrays of integrated circuit memory devices.

BACKGROUND OF THE INVENTION

Integrated circuit memory devices are widely used in consumer and commercial electronics. As the integration density of these devices continues to increase, the number of cells in a memory cell array may continue to increase. With the increased number of memory cells, it may become increasingly difficult to test the memory cell array.

As is well known to those of skill in the art, a memory cell array generally includes a plurality of data line outputs. In a normal, non-test mode, the data on the data line outputs is transmitted to global output lines. In contrast, in a parallel bit test mode in which a plurality of data bits are concurrently output for comparison testing, a separate parallel bit test circuit may be used. In a conventional parallel bit test circuit, a plurality of data units controlled by one column select line are output through a sense amplifier. The output data is selected in groups of two to be compared in a primary comparison. The compared data in the primary comparison is again selected in groups of two to be compared in a secondary comparison, and the compared data in the secondary comparison are again selected in groups of two to be compared in a tertiary comparison. Thus, the comparison operation may be extended. Separate output drivers may be provided for each of the compared data units. Signals output by each of the output drivers may be transmitted to an output multiplexer.

Referring now to FIG. 7, conventional parallel bit test circuits and methods include normal drivers 701, 703, 705, 707, 709, 711, 713 and 715. In a memory cell array 760, eight data units are amplified by corresponding sense amplifiers to become data line outputs TD00/TD0B0, TD01/TD0B1, TD02/TD0B2, TD03/TD0B3, TD04/TD0B4, TD05/TD0B5, TD06/TD0B6 and TD07/TD0B7. The normal drivers 701, 703, 705, 707, 709, 711, 713 and 715, in a normal output mode, respectively transmit the corresponding data line outputs TD00, TD01, TD02, TD03, TD04, TD05, TD06 and TD07 to global output lines FDI00, FDI01, FDI02, FDI03, FDI04, FDI05, FDI06 and FDI07. In the parallel bit test mode, data of the data line outputs TD00, TD01, TD02, TD03, TD04, TD0S, TD06 and TD07 is compared in response to a selection signal that indicates a selected number of compared bits and outputs the compared signals. The test drivers 761, 763, 765, 767, 769, 771 and 773 receive corresponding output signals of the data comparison.

The parallel bit test circuit includes primary comparators 727, 729, 731 and 733, primary switches 735, 737, 739 and 741, secondary comparators 743 and 745, secondary switches 747 and 749, a tertiary comparator 751 and a tertiary switch 759. The primary comparator 727 compares TD00 to TD01 to output the primary compared signal FCOO. The primary comparator 729 compares TD02 to TD03 to output the primary compared signal FC01. The primary comparator 731 compares TD04 to TD05 to output the primary compared signal FC02. The primary comparator 733 compares TD06 to TD07 to output the primary compared signal FC03. Also, in the primary parallel test mode, the primary switch 735 receives FC00 to output FC00 to an input terminal of the test driver 761. In the primary parallel test mode, the second switch 737 receives FC01 to output FC01 to an input terminal of the test driver 763. In the primary parallel test mode, the primary switch 739 receives FC02 to output FC02 to an input terminal of the test driver 765. In the primary parallel test mode, the primary switch 741 receives FC03 to output FC03 to an input terminal of the test driver 767.

The secondary comparator 743 compares FC00 to FC01 to output a secondary compared signal SC00. The secondary comparator 745 compares FC02 to FC03 to output a secondary compared signal SC01. In the secondary parallel test mode, the secondary switch 747 receives SC00 to output SC00 to an input terminal of the test driver 769. In the secondary parallel test mode, the secondary switch 749 receives SC01 to output SC0L to an input terminal of the test driver 771.

The tertiary comparator 751 compares SC00 to SC0L to output a tertiary compared signal TC0. In the tertiary parallel test mode, the tertiary switch 759 receives TC0 to output TC0 to an input terminal of the test driver 773.

Since the distance between a sense amplifier and a multiplexer may vary based on the internal layout of the integrated circuit, the size of the drivers 761, 763, 765, 767, 769, 771 and 773 that drive some of the multiplexers may need to increase. Moreover, the number of output drivers may depend on the number of comparisons.

Accordingly, conventional parallel bit test circuits and methods may consume an excessive area in an integrated circuit memory device. Moreover, since the number and/or size of drivers connected to the data output lines may vary, a difference in speed between input and output data in normal mode may be produced.

SUMMARY OF THE INVENTION

It is therefore an object of the present invention to provide improved circuits and methods for testing integrated circuit memory devices.

It is another object of the present invention to provide integrated circuit memory device testing circuits and methods that need not unduly increase the integrated circuit area that is occupied by test circuitry.

It is still another object of the present invention to provide integrated circuit memory testing circuits and methods that can reduce the speed differences between input and output data in normal mode.

These and other objects are provided according to the present invention by integrated circuit memory device testing circuits and methods that compare data on a selected number of the data line outputs of a memory cell array to one another to produce comparison results, in response to a selection signal that indicates the selected number of the data line outputs to be compared to one another. A shared test driver is responsive to the comparison circuit to provide the comparison results to an associated global output line for at least two values of the selection signal that indicate at least two selected numbers of data line inputs to be compared to one another. By sharing test drivers, separate test drivers need not be provided for each selected number of the data line outputs that are compared to one another. The number of test drivers may therefore be reduced so that the area occupied by the testing circuits may be reduced.

More specifically, circuits and methods for testing data on data line outputs of a memory cell array includes a plurality of normal drivers that transmit the data on the data line outputs to global output lines in a normal output mode. Comparison circuits and methods compare the data on a selected number of the data line outputs to one another to produce comparison results, in response to a selection signal that indicates the selected number of the data line outputs to be compared to one another, in a parallel bit test mode. The normal drivers preferably do not transmit the data on the data line outputs to the global output lines in the parallel bit test mode.

A plurality of shared test drivers are responsive to the comparison circuit to provide the comparison results to at least one of the global output lines for at least two values of the selection signal. Preferably at least one of the test drivers is responsive to the comparison circuit to provide the comparison results to an associated global output line for at least two values of the selection signal that indicate at least two selected numbers of data line inputs to be compared to one another. Accordingly, the number of test drivers need not be unduly increased and speed differences between input and output data in normal mode need not be produced. Differences in output speeds between output data on different global output lines may also be reduced.

Comparison circuits according to the invention preferably comprise a plurality of primary comparators, each of which compares the data on a first selected number of the data line outputs to one another to produce primary comparison results. A plurality of secondary comparators compare the primary comparison results to one another to produce secondary comparison results. At least one tertiary comparator compares the secondary comparison results to one another to produce tertiary comparison results. The primary comparators may operate in response to a selection signal that indicates a first selected number of the data line outputs are to be compared to one another in the parallel bit test mode. The secondary comparators may operate in response to a selection signal that indicates that a second selected number of the data line outputs that is greater than the first selected number are to be compared to one another in the parallel bit test mode. The tertiary comparator may operate in response to a selection signal that indicates that an even greater number of data line outputs are to be compared to one another in the parallel bit test mode. Accordingly, the area occupied by the parallel bit testing circuits in the integrated circuits need not be increased unduly. The speed differences between input and output of the data in normal mode can be reduced, and the difference in output speeds between output data can be reduced.

DETAILED DESCRIPTION OF PREFERRED EMBODIMENTS

Figure 1:
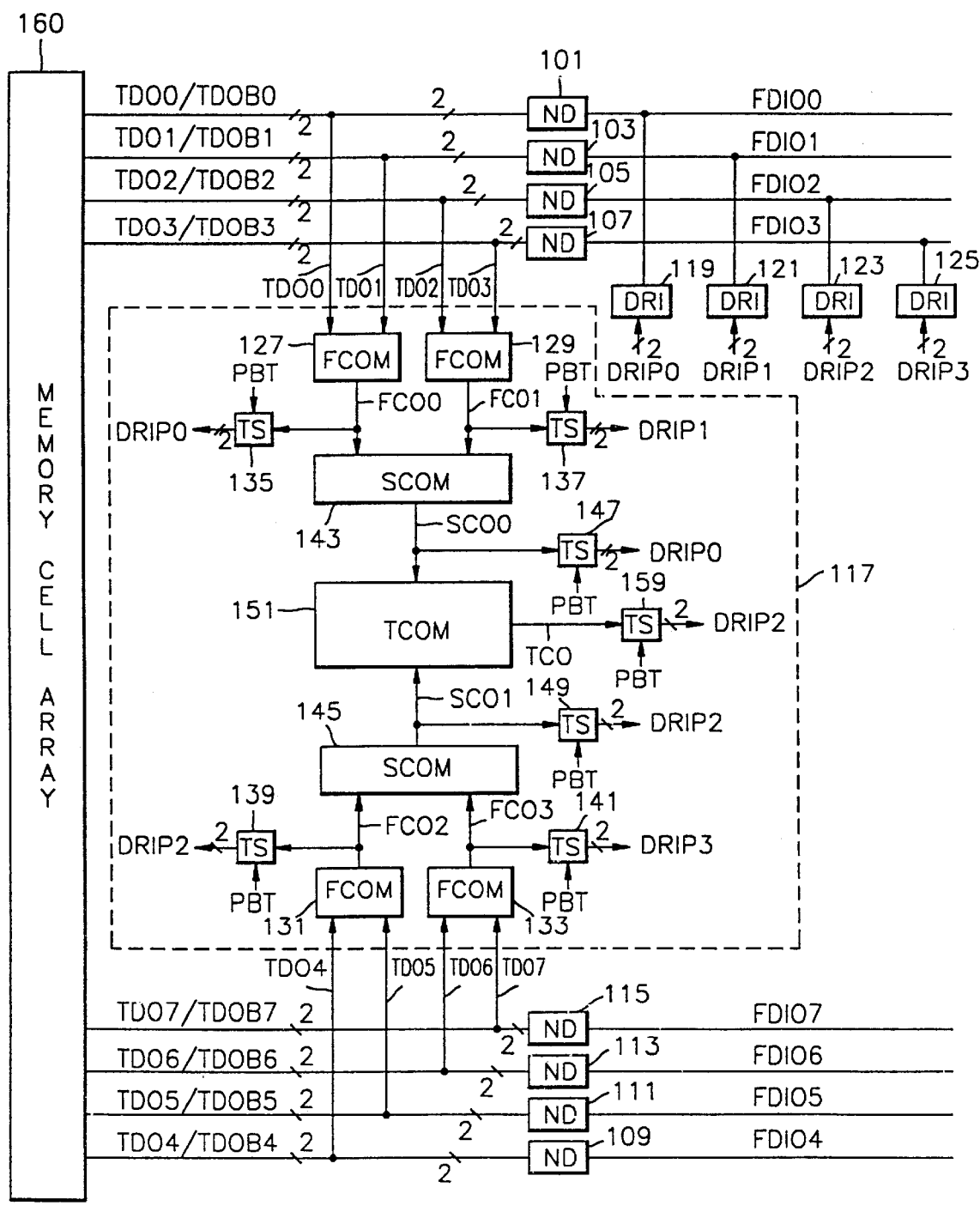
FIG. 1 is a block diagram of a parallel bit test circuits and methods, according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. In FIG. 1, for example, eight data units are shown as being output from a memory cell array. However, the number of output data units may be increased or decreased.

Referring now to FIG. 1, parallel bit test circuits and methods according to the present invention include normal drivers 101, 103, 105, 107, 109, 111, 113 and 115, a comparison circuit 117 and shared test drivers 119, 121, 123 and 125. In a memory cell array 160, eight data units are amplified by corresponding sense amplifiers to become data line outputs TD00/TD0B0, TD01/TD0B1, TD02/TD0B2, TD03/TD0B3, TD04/TD0B4, TD05/TD0B5, TD06/TD0B6 and TD07/TD0B7. The normal drivers 101, 103, 105, 107, 109, 111, 113 and 115, in a normal output mode, respectively transmit the corresponding data line outputs TD00, TD01, TD02, TD03, TD04, TD05, TD06 and TD07 to global output lines FDI00, FDI01, FDI02, FDI03, FDI04, FDI05, FDI06 and FDI07. The comparison circuit 117, in the parallel bit test mode, compares data of the data line outputs TD00, TD01, TD02, TD03, TD04, TD05, TD06 and TD07 in response to a selection signal that indicates a selected number of compared bits and outputs the compared signals. The shared test drivers 119, 121, 123 and 125 receive corresponding output signals of the comparison circuit 117, and transmit the input signals to the corresponding global output line.

The normal drivers 101, 103, 105, 107, 109, 111, 113 and 115, in the normal output mode, respectively receive the data line outputs TD00, TD01, TD02, TD03, TD04, TD05, TD06 and TD07 and output the input data line outputs to the global output lines FDI00, FDI01, FDI02, FDI03, FDI04, FDI05, FDI06 and FDI07. Also, the normal drivers 101, 103, 105, 107, 109, 111, 113 and 115, in the parallel bit test mode, do not drive the global output lines.

Figure 2:
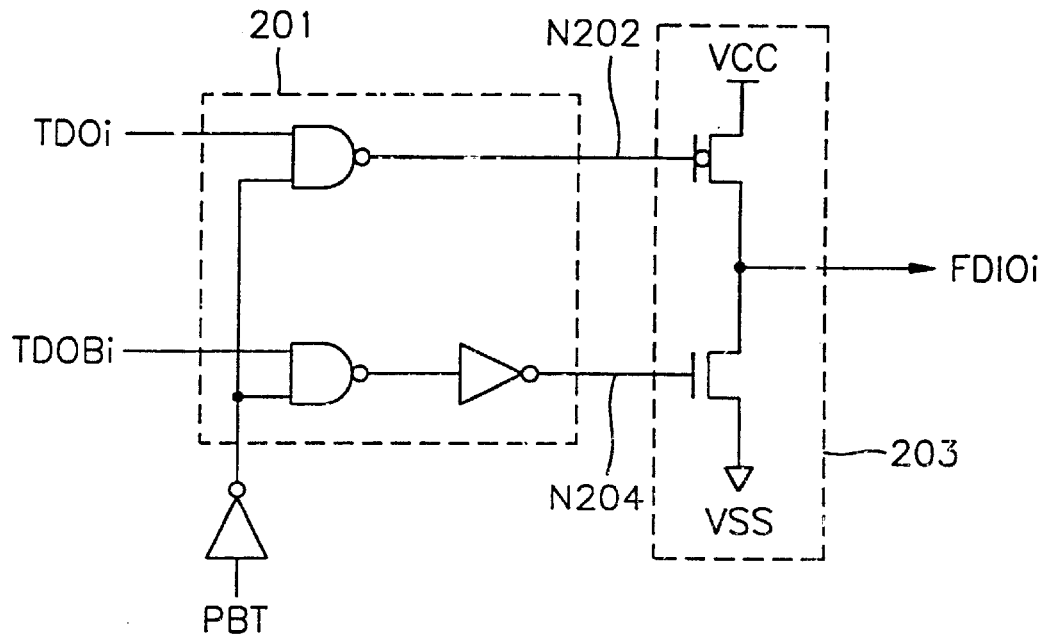
FIG. 2 is a schematic diagram of a normal driver of FIG. 1.

Referring to FIG. 2, a normal driver of the present invention includes a switching unit 201 and a driving unit 203. The switching unit 201 is controlled by a parallel bit test indicating signal PBT. The driving unit 203 is driven by output signals N202 and N204 of the switching unit 201. In detail, in the normal driver of the parallel bit test mode, the level of the parallel bit test indicating signal PBT is high. Thus, the switching unit 201 does not respond to the input signal TD0$i$. However, the level of the parallel bit test indicating signal PBT in the normal mode is low. In the normal output mode, i.e., when the signal PBT is at a low level, if the level of the input signal TD0$i$ is high and the level of an inverted input signal TD0B$i$ is low, the level of an output signal of the switching unit 201 is low and the level of the output FDI0$i$ of the normal driver becomes high. However, the input signals of the normal drivers are connected to the data line outputs TD00, TD01, TD02, TD03, TD04, TD05, TD06, TD07 and TD08, respectively. Also, the output signals of the normal drivers are connected to the global output lines FDI00, FDI01, FDI02, FDI03, FDI04, FDI05, FDI06 and FDI07, respectively. Thus, each of the normal drivers in the normal output mode transmits a data output to a corresponding global output line.

Referring back to FIG. 1, the comparison circuit 117 includes primary comparators 127, 129, 131 and 133, primary switches 135, 137, 139 and 141, secondary comparators 143 and 145, secondary switches 147 and 149, a tertiary comparator 151 and a tertiary switch 159. The primary comparator 127 compares TD00 to TD01 to output the primary compared signal FC00. The primary comparator 131 compares TD04 to TD05 to output the primary compared signal FC02. The primary comparator 133 compares TD06 to TD07 to output the primary compared signal FC03. Also, in the primary parallel test mode, the primary switch 135 receives FC00 to output FC00 to an input terminal of the test driver 119. In the primary parallel test mode, the second switch 137 receives FC01 to output FC01 to an input terminal of the test driver 121. In the primary parallel test mode, the primary switch 139 receives FC02 to output FC02 to an input terminal of the test driver 123. In the primary parallel test mode, the primary switch 141 receives FC03 to output FC03 to an input terminal of the test driver 125.

The secondary comparator 143 compares FC00 to FC01 to output a secondary compared signal SC00. The secondary comparator 145 compares FC02 to FC03 to output a secondary compared signal SC01. In the secondary parallel test mode, the secondary switch 147 receives SC0D to output SC00 to an input terminal of the test driver 119. Thus, test driver 119 is shared between the primary and secondary parallel test modes. In the secondary parallel test mode, the secondary switch 149 receives SC01 to output SC01 to an input terminal of the test driver 123. Thus, test driver 123 is shared between the primary and secondary parallel test modes.

The tertiary comparator 151 compares SC00 to SC01 to output a tertiary compared signal TC0. In the tertiary parallel test mode, the tertiary switch 159 receives TC00 to output TC00 to an input terminal of the test driver 123. Thus, test driver 123 is shared between the primary, secondary and tertiary parallel test modes.

Figure 3:
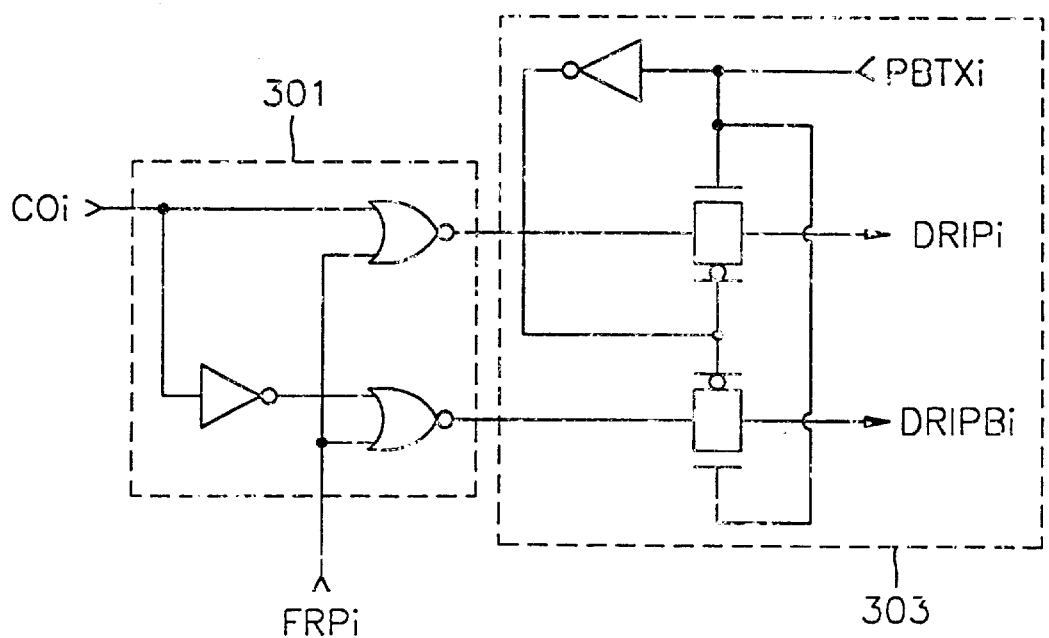
FIG. 3 is a schematic diagram of a switch of FIG. 1.

FIG. 3 shows one of the switches 135, 137, 139, 141, 147, 149 and 159 of FIG. 1. Referring to FIG. 3, the switches 135, 137, 139, 141, 147, 149 and 159 include a switching unit 301 and a transmission unit 303. The switching unit 301 responds to an input signal C0$i$ when a test order control signal FRPi is at a low level. The transmission unit 303 transmits output signals DRIPi and DRIPi to the corresponding test driver when a parallel test bit indicating signal PBTXi is high. The switching unit 301 does not respond to the input signal C0$i$ when the test order control signal FRPi is high. In the switch of FIG. 3, the input signal C0$i$ is connected to an output signal of a corresponding comparator. In the switch of FIG. 3, the output signals DRIPi and DRIPBi are connected to the input signals of the corresponding test driver. Also, the test order control signal FRPi is connected to a test order control signal corresponding to the switch. The parallel test bit indicating signal PBTXi is connected to a parallel test bit indicating signal, corresponding to the number of the concurrently compared test bits.

A switch of FIG. 3 will now be described with reference to the primary switch 137. The input signal C0$i$ of the primary switch 137 is connected to an output signal FC01 of the primary comparator 129. The output signals DRIPi and DRIPBi of the primary switch 137 are connected to the input signals DRIP1 and DRIPB1 of the test driver 121. Also, the test order control signal FRPi of the primary switch 137 is connected to a primary parallel test mode indicating signal FRPFC. The parallel test bit indicating signal PBTXi of the primary switch 137 is connected to PBTX4, described below, indicating four data units which are output in parallel.

The switch of FIG. 3 will be now described with reference to the secondary switch 147. The input signal C0$i$ of the secondary switch 147 is connected to the output signal SC00 of the secondary comparator 143. The output signals DRIP1 and DRIPBi of the secondary switch 147 are connected to the input signals DRIP0 and DRIPB0 of the test driver 119. Also, the test order control signal FRPi of the secondary switch 137 is connected to the secondary parallel test mode indicating signal FRPSC. The parallel test bit indicating signal PBTXi of the secondary switch 147 is connected to PBTX2, indicating parallel output of two data units.

The switch of FIG. 3 will now be described with reference to the tertiary switch 159. The input signal C0$i$ of the tertiary switch 159 is connected to the output signal TC0 of the tertiary comparator 151. The output signals DRIPi and DRIPBi of the tertiary switch 159 are connected to the input signals DRIP2 and DRIPB2 of the test driver 123. The test order control signal FRPi of the tertiary switch 159 is connected to the tertiary parallel test mode indicating signal FRPTC. Also, the parallel test bit indicating signal PBTXi, of the tertiary switch 159 is connected to PBTX1 indicating parallel output of one data units. The primary, secondary and tertiary parallel test mode indicating signals FRPFC, FRPSC and FRPTC are signals indicating a primary comparison a secondary comparison, and a tertiary comparison, respectively.

Figure 4:
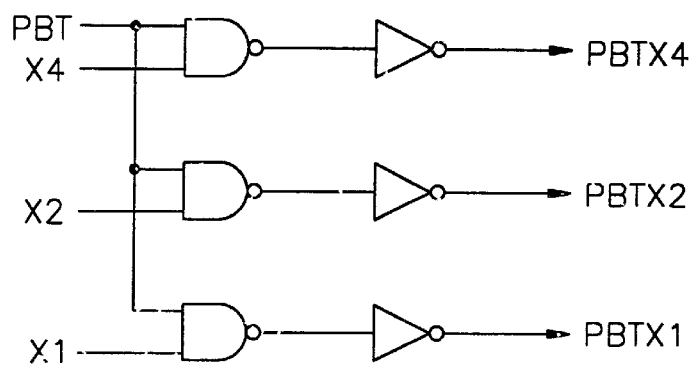
FIG. 4 is a schematic diagram of a generation circuit of a parallel test bit number indicating signal PBTXi, according to the present invention.

Referring to FIG. 4, when in the parallel bit test mode, i.e., when the parallel bit test indicating signal PBT is low, a signal is activated in response to a signal Xi indicating the memory structure. That is, when the signal X4 for outputting four data units is activated, the parallel test bit indicating signal PBTX4 is activated. When the signal X2 for outputting two data units is activated, a parallel test bit indicating signal PBTX2 is activated. When the signal X1 for outputting one data unit is activated, a parallel test bit indicating signal PBTXi is activated.

Figure 5:
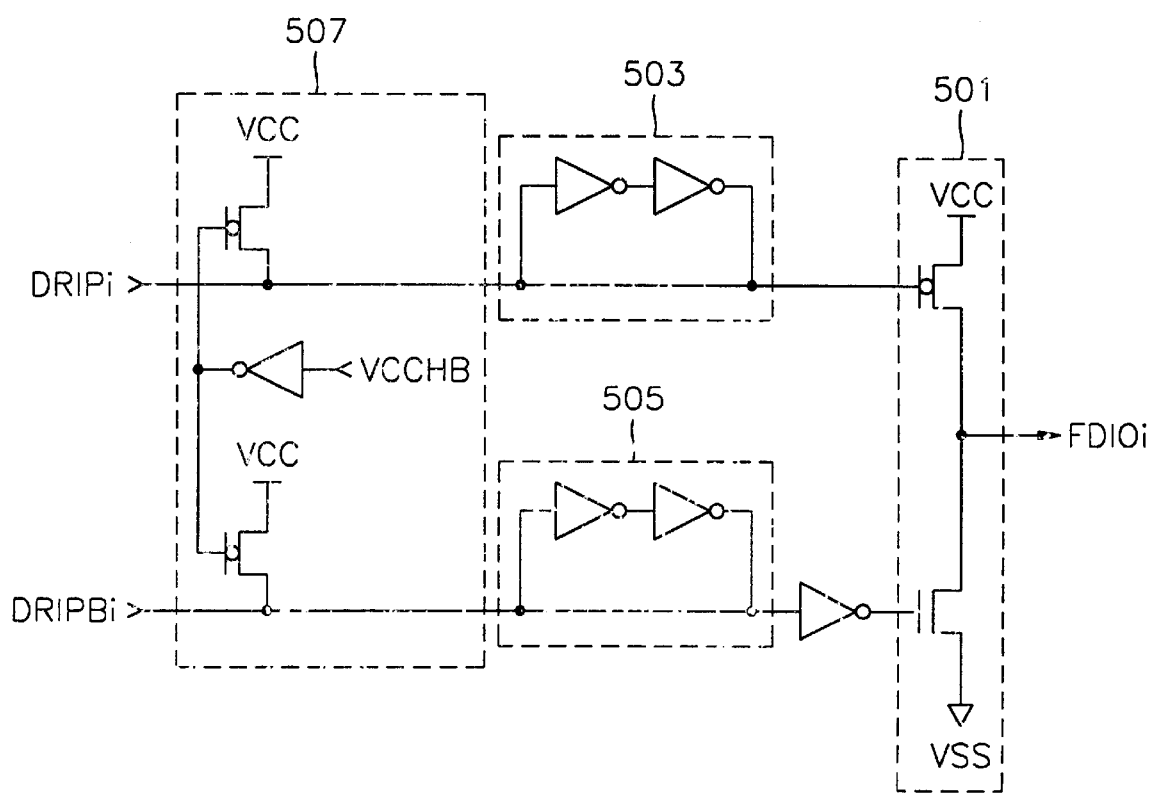
FIG. 5 is a schematic diagram of a test driver of FIG. 1.

The embodiment of FIG. 5 will be described with reference to the test driver 119 of FIG. 1. The test driver 119 of FIG. 1 includes input terminals DRIPi and DRIPBi, a driving unit 501, latch units 503 and 505 and a precharge unit 507. The input terminals DRIPi and DRIPBi are connected to the output signals DRIP0 and DRIPB0 of the comparing circuit 117. The driving unit 501 is driven by the output signal DRIP0 and an inverted output signal DRIPB0 of the comparison circuit 117. The latch unit 503 latches the output signal DRIP0 of the comparator 117 received by the input terminal DRIPi. The latch unit 505 latches the inverted output signal DRIPB0 of the comparing circuit 117 received through the input terminal DRIPBi. Also, the precharge unit 507 precharges the output signal DRIP0 and the inverted output signal DRIPB0 of the comparing circuit 117 received by the input terminal, during power-up. The output signal FDI0$i$ of the test driver 119 is connected to a global output line FDI00.

In the parallel bit test circuit of the present embodiment, outputs of the driver connected to global output lines FDI00, FDI01, FDI02 and FDI03 are connected to outputs of one normal driver and one test driver. The signals of the global output lines FDI00, FDI01, FDI02 and FDI03 are externally output through an output multiplexer.

Figure 6:
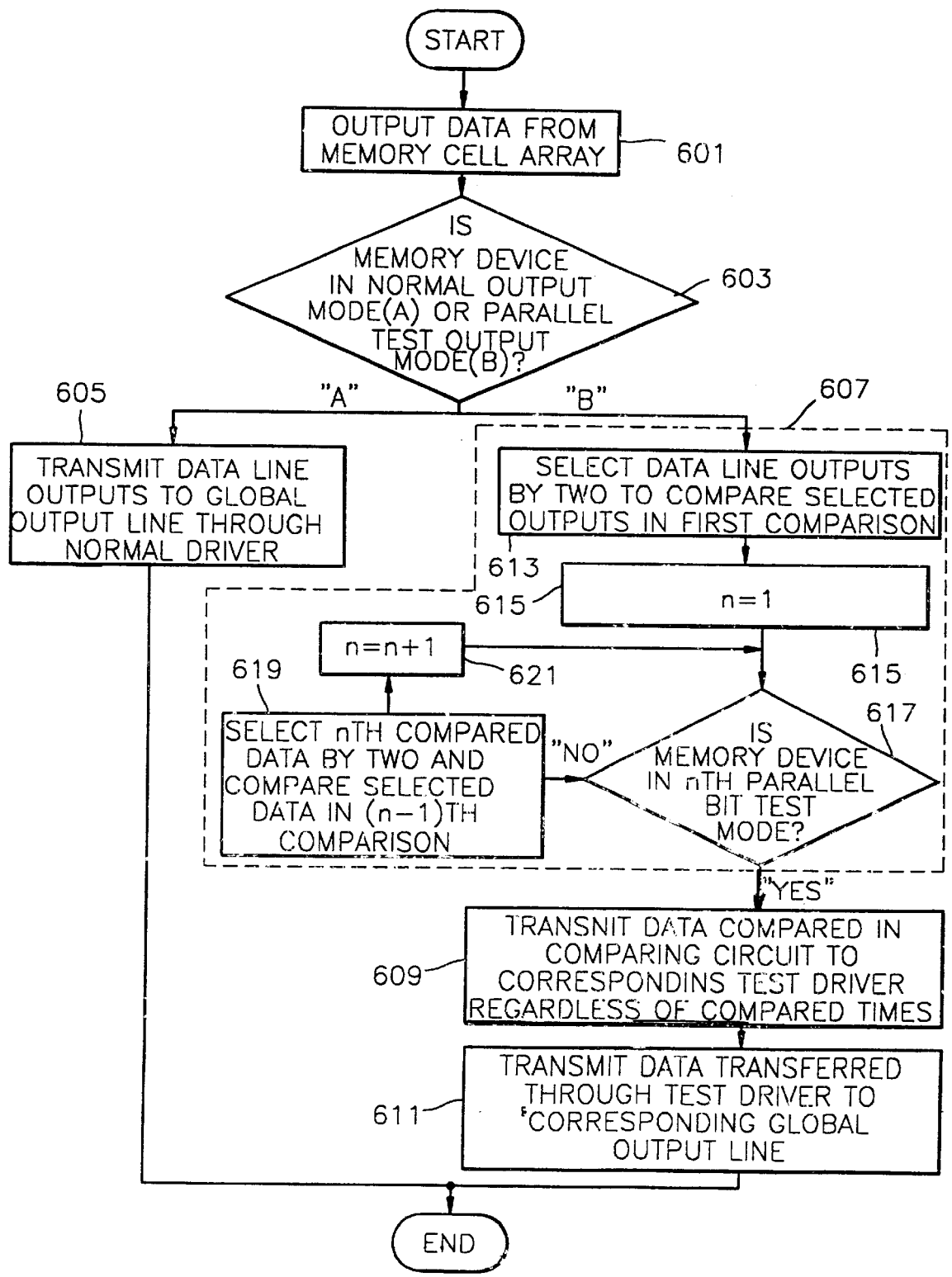
FIG. 6 is a flowchart illustrating parallel bit testing, according to the present invention.
Figure 7:
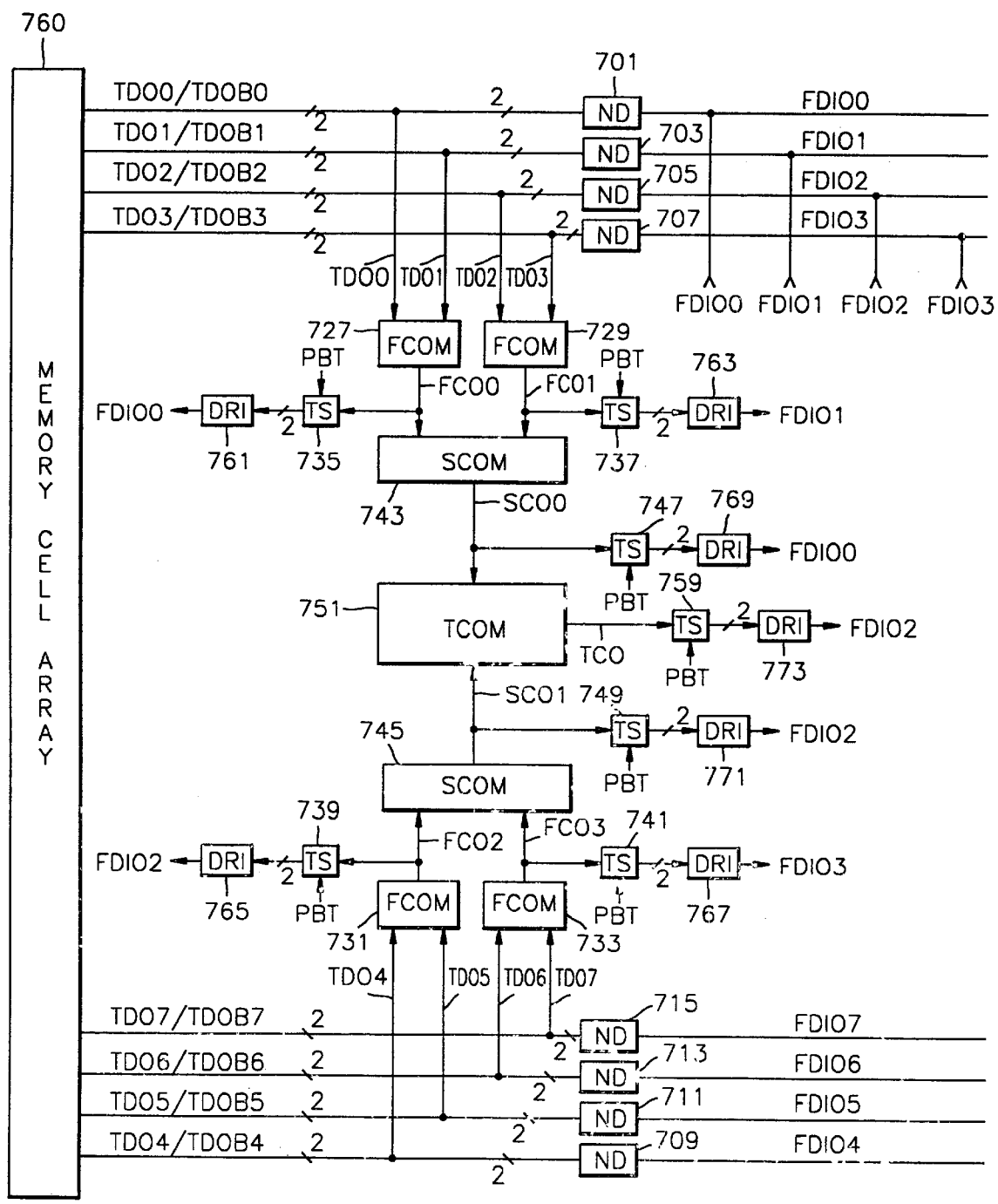
FIG. 7 is a block diagram of conventional parallel bit test circuits and methods.

Referring to FIG. 6, parallel bit testing will be described. Data is output from a memory cell array (Block 601). It is determined whether the memory device is in a normal output mode or a parallel test output mode (Block 603). In a normal output mode, the data line outputs TD00, TD01, TD02, TD03, TD04, TD05, TD06 and TD07 are transmitted to global output lines FDI00, FDI01, FDI02, FDI03, FDI04, FDI05, FDI06 and FDI07 through normal drivers 101, 103, 105 and 107 (Block 605). The data line outputs in a parallel test output mode are compared by a comparison circuit 117 (Block 607). The data compared in the comparison circuit 117 is transmitted to corresponding test drivers 119, 121, 123 and 125 regardless of the number of comparisons (Block 609), so that the test drivers are shared. The data transmitted through the test driver is transmitted to the corresponding global output line (Block 611).

In Block 607, the data line outputs TD00, TD01, TD02, TD03, TD04, TD05, TD06 and TD07 are selected by two to be compared in a primary comparison (Block 613). An order n of a parallel bit test is made to be 1 (Block 615). It is determined 10 whether or not a tested memory device is in an nth parallel bit test mode (Block 617). If the device is in the nth parallel bit test mode, Block 609 is performed. If the device is not in the nth parallel bit test mode, the nth compared data is selected by two and the selected data is compared in a (n+1)th comparison (Block 619). After Block 619, n is incremented by 1 (Block 621) and then Block 617 is performed again.

Eight data units are output by a memory cell array and the output data is compared in the present embodiment, but the number of data units output from the memory cell array can be increased for example to 16, 32 or 64, or reduced for example to 4 or 2.

This invention may be embodied in many different forms and should not be construed as being limited to the embodiments set forth herein. Rather, these embodiments are provided so that this disclosure will be thorough and complete, and will fully convey the concepts of the invention to those skilled in the art.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A circuit that tests data on data line outputs of a memory cell array, comprising:
   a plurality of normal drivers that transmit the data on the data line outputs to global output lines in a normal output mode;
   a comparison circuit that compares the data on a selected number of the data line outputs to one another to produce comparison results in response to a selection signal that indicates the selected number of the data line outputs to be compared to one another, in a parallel bit test mode; and
   a plurality of test drivers that are responsive to the comparison circuit, a respective one of which provides the comparison results to at least one of the global output lines for at least two values of the selection signal.

2. A circuit according to claim 1 wherein the normal drivers do not transmit the data on the data line outputs to the global output lines in the parallel bit test mode.

3. A circuit according to claim 1 wherein the comparison circuit comprises:
   at least one primary comparator that compares the data on a first selected number of the data line outputs to one another to produce primary comparison results, in response to a selection signal that indicates the first selected number of the data line outputs are to be compared to one another.

4. A circuit according to claim 1 wherein the comparison circuit comprises:
   a plurality of primary comparators, each of which compares the data on a first selected number of the data line outputs to one another to produce primary comparison results; and
   at least one secondary comparator that compares the primary comparison results to one another to produce secondary comparison results, in response to a selection signal that indicates that a second selected number of the data line outputs that is greater than the first selected number, are to be compared to one another in the parallel bit test mode.

5. A circuit according to claim 1 wherein the comparison circuit comprises:
   a plurality of primary comparators, each of which compares the data on a first selected number of the data line outputs to one another to produce primary comparison results;
   a plurality of secondary comparators that compare the primary comparison results to one another to produce secondary comparison results; and
   at least one tertiary comparator that compares the secondary comparison results to one another to produce tertiary comparison results in response to a selection signal that indicates that a second selected number of the data line outputs that is greater than the first selected number, are to be compared to one another in the parallel bit test mode.

6. A circuit according to claim 1 in combination with a memory cell array including the plurality of data line outputs.

* * * * *